United States Patent [19]

Peirce et al.

[11] Patent Number: 5,246,730
[45] Date of Patent: Sep. 21, 1993

[54] PROCESS FOR CONFORMAL COATING OF PRINTED CIRCUIT BOARDS

[75] Inventors: Roger J. Peirce, Feasterville, Pa.; Raymond P. Becker, Gurnee, Ill.

[73] Assignee: Conductive Containers, Inc., Northbrook, Ill.

[21] Appl. No.: 794,037

[22] Filed: Nov. 19, 1991

Related U.S. Application Data

[62] Division of Ser. No. 479,471, Feb. 13, 1990, Pat. No. 5,102,712.

[51] Int. Cl.⁵ .................................. C23C 26/00
[52] U.S. Cl. ............................ 427/96; 427/271; 427/272; 427/282; 427/421; 427/458; 118/505
[58] Field of Search .............. 427/96, 271, 14.1, 272, 427/282, 458, 421; 118/301, 504, 505

[56] References Cited

U.S. PATENT DOCUMENTS

| | | | |
|---|---|---|---|
| 3,973,321 | 8/1976 | Horton | 427/96 |
| 4,300,184 | 11/1981 | Colla | 361/397 |
| 4,353,970 | 10/1982 | Dryczynski | 427/14.1 |
| 4,678,531 | 7/1987 | Metzger | 427/282 |
| 4,784,310 | 11/1988 | Metzger | 427/282 |
| 4,820,196 | 4/1989 | Roselle | 439/519 |
| 4,830,922 | 5/1989 | Sparrowhawk | 427/96 |
| 4,959,752 | 9/1990 | Samarov | 427/96 |
| 5,102,712 | 4/1992 | Peirce | 428/76 |

*Primary Examiner*—Shrive Beck
*Assistant Examiner*—Vi Duong Dang
*Attorney, Agent, or Firm*—Arnold White & Durkee

[57] ABSTRACT

A method of applying a conformal coating to a printed circuit board and components attached thereto while leaving selected components attached thereto uncoated, comprises the steps of providing a printed circuit board having a multiplicity of components attached thereto, including selected components that are not to be coated; enclosing the selected components within conductive protective enclosures sized to enclose the selected components therein and thereby protect those components from the intrusion of conformal coating material, the enclosures having sufficient electrical conductivity to discharge electrostatic charges therefrom when one of the enclosures is contacted by an electrically conductive medium, thereby protecting the components attached to the printed circuit board from damage due to the discharge of electrostatic charges from the enclosures; applying a conformal coating to the printed circuit board, thereby conformal coating the enclosures and the components which are not protected by the enclosures; and removing the coated enclosures from the selected components.

3 Claims, 3 Drawing Sheets

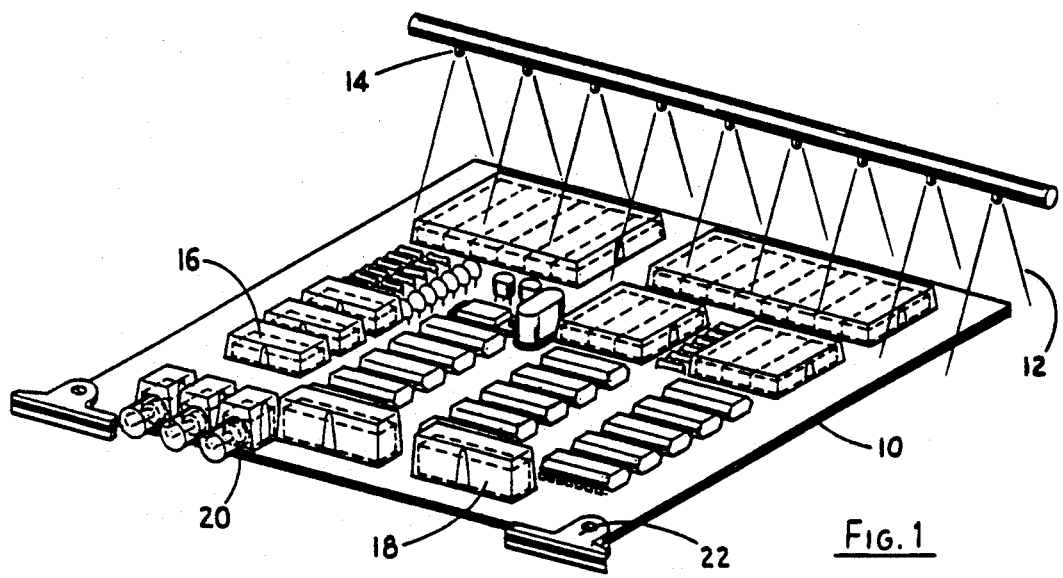
Fig. 1
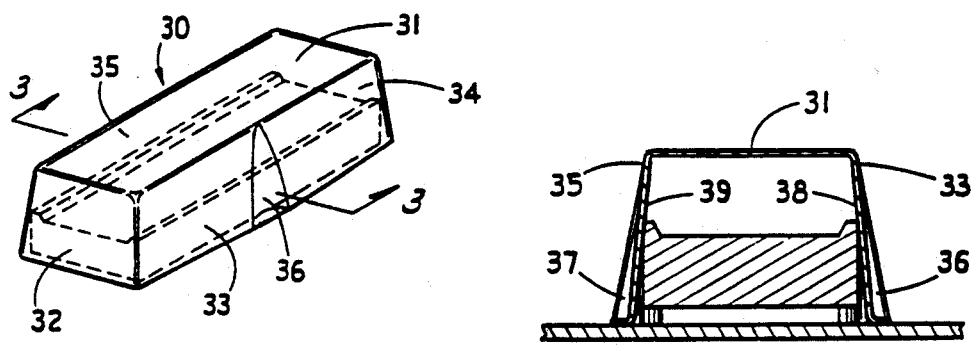
Fig. 2
Fig. 3
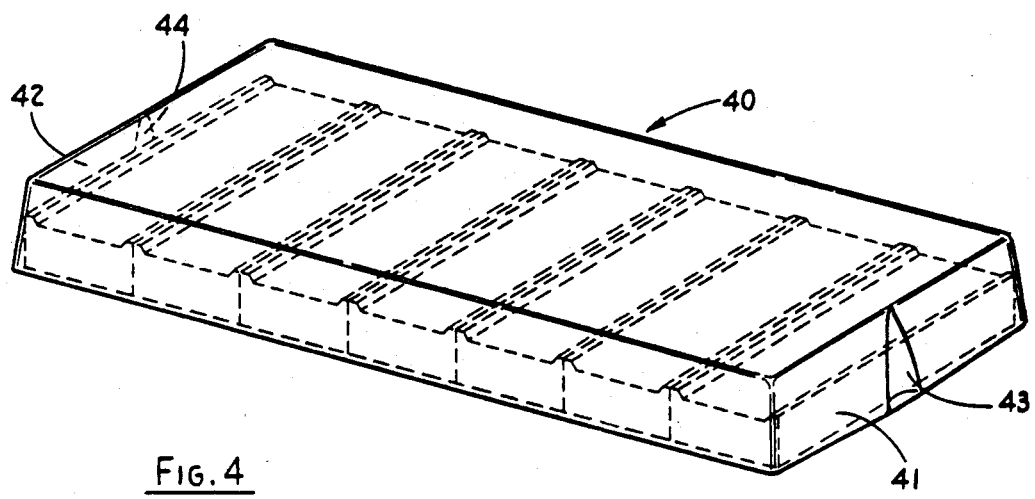
Fig. 4

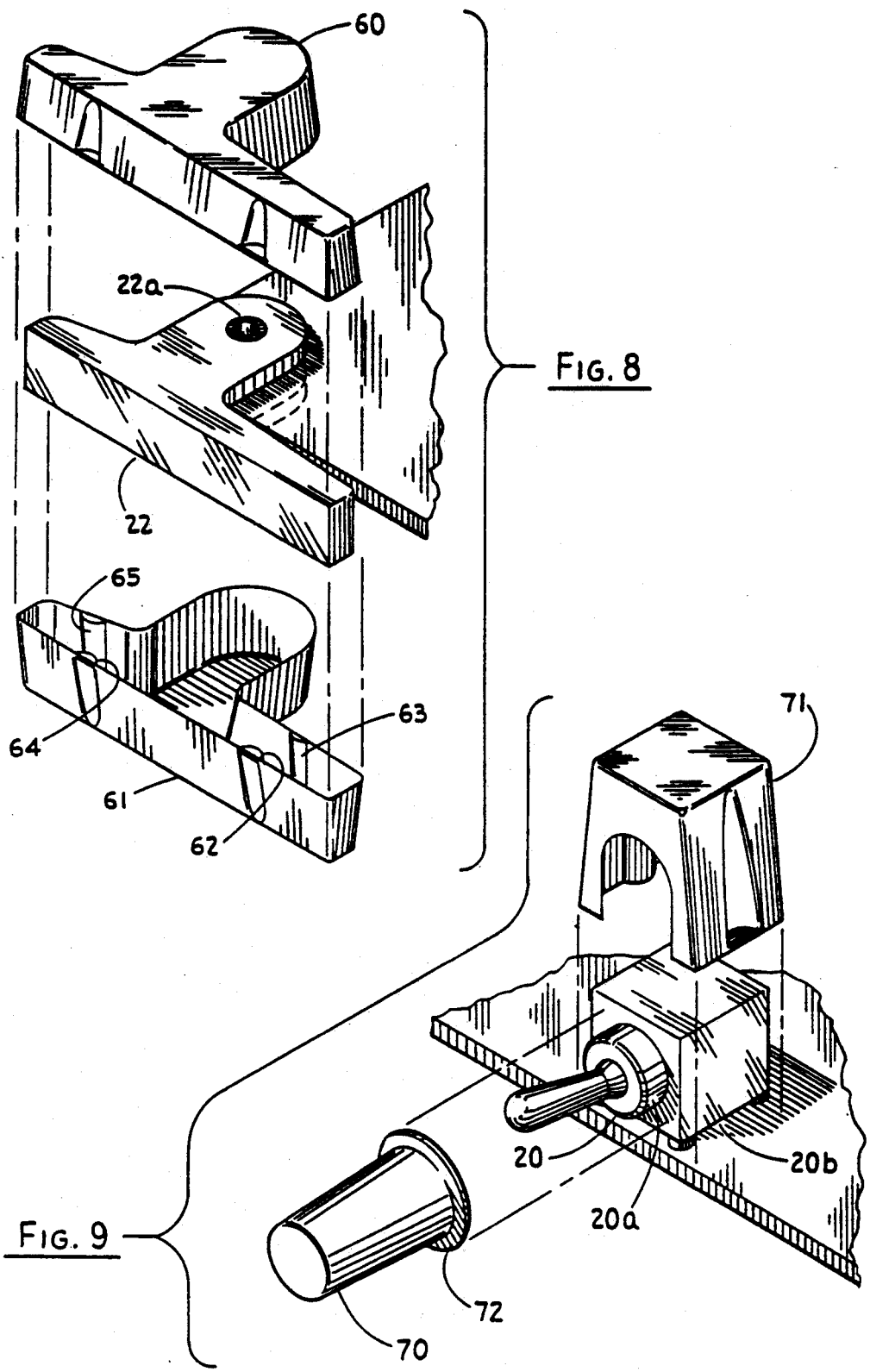

PROCESS FOR CONFORMAL COATING OF PRINTED CIRCUIT BOARDS

This ia a divisional of copending application Ser. No. 07/479,471 filed on Feb. 13, 1990, now U. S. Pat. No. 5,102,712.

FIELD OF THE INVENTION

The present invention generally relates to the manufacturing of printed circuit boards, and more particularly, to the conformal coating of printed circuit boards.

BACKGROUND OF THE INVENTION

Printed circuit boards manufactured for military and commercial users are frequently coated with a protective film, referred to as a "conformal coating", to avoid degradation in electrical performance due to deleterious environmental effects, e.g., water, dust, and air-borne pollutants. The most damaging of the adverse environmental effects is generally recognized to be humidity. Humidity corrodes electrical components, lowers resistance between conductors, accelerates high voltage breakdowns, and even causes destructive short circuits. In addition to protecting the printed circuit board from air-borne contaminants, conformal coatings protect against contaminants inadvertently deposited by persons handling the board, e.g., grease, hair, cosmetics, and fingerprints.

Conformal coatings are generally coatings of synthetic resins which form a tough, non-conductive, water-impervious film. Conformal coatings are applied evenly and thinly over the entirety of the printed circuit board. Generally, these coatings are from about 0.005 to about 0.0005 inch thick. For economic reasons conformal coatings are generally applied by machine using mass production techniques. The most popular of these techniques is spraying the coating onto the board. Although several conformal coating systems are available, each serves primarily the same function, and for purposes of the present invention they are indistinguishable.

Conformal coating material if misapplied will damage components attached to the printed circuit board, rendering the board useless. For example, if the conformal coating material were allowed to enter into and coat the electrical contacts of an unoccupied integrated circuit socket, that socket would become permanently inoperable since it could no longer become electrically connected to an integrated circuit. Depending on the circuit path in which the useless socket is situated, the entire printed circuit board might become useless.

Several non-electrical components on a board, such as pivoting ejector levers and toggle switches, are movable. Therefore, such components must also remain uncoated if they are to remain functional. Other components such as fuses and EPROMs cannot be coated because they must be removable for replacement purposes in the future. Accordingly, there are several electrical and non-electrical components which are used on printed circuit boards and which must remain uncoated if the board is to function properly.

Masking techniques are typically used to avoid the conformal coating of those components on a printed circuit board which are to remain uncoated. The most popular of these masking techniques uses adhesive masking tapes. According to this technique, a length of adhesive tape is tailored to conform to a surface of a selected component, and then manually applied to the surface of the component. Since a single printed circuit board often includes multiple components requiring masking, tape masking is a labor-intensive, time-consuming, and expensive technique. For example, masking a single component on one board may take an experienced technician up to 30 minutes. Multiply the period required to mask one board by the hundreds of thousands of boards coated annually in the United States alone, and it is apparent that the cost of masking printed circuit boards with tape is substantial. Furthermore, because the size of the components masked is generally small, and because printed circuit boards themselves have become so crowded, applying these tapes is a tedious task, and errors often occur, leaving critical components unmasked or only partially masked. Accordingly, numerous boards are ruined, or must be extensively reworked.

A further problem associated with the tape masking of components, separate and apart from applying the tape, is the subsequent removal of the tape. Often, because the tapes are sealed beneath the conformal coating, the use of a sharp instrument, such as a razor, is required. This can result in damage to the board. When considering that a conformal coating is only 0.0005 to 0.005 inch thick, it becomes apparent that a steady and gentle hand is required to cut through the thin coating to retrieve the pliable tape beneath without damaging the board The additional step of removing the tape also increases manufacturing costs by raising labor costs. Removing the coated tape can require a great deal of additional time. Again, multiplying the time required to remove the coated tape from one board by the total number of boards coated results in significant added costs.

A further problem in the conformal coating and manufacture of printed circuit boards is static electrical discharge. Electrical integrated circuit chips are extremely susceptible to the ravages of static electrical discharge. For example, when subjected to static electrical discharge, integrated circuits can be destroyed, or the parameters of the integrated circuits can be significantly altered. It has been found that static electrical discharges sufficient to destroy or alter integrated circuits can be produced through handling, transporting, masking, or coating the printed circuit board.

Damage from static electrical discharge often occurs during the conformal coating process. Electrostatic charges can be generated by the conformal coating process itself as the liquid droplets pass through a spray nozzle and then the air before being deposited o the board. The adhesive masking tapes also generate large static charges when peeled from their reels, and when removed from the surface of the masked component. These electrostatic charges can be in the tens of thousands of volts. Unfortunately, these charges are often discharged through the circuit board causing damage to the susceptible components thereon. For example, during the application or removal of masking tape, a technician or tape carrying an electrostatic charge may contact an electrical conductor on the board, causing a discharge which damages one or more integrated circuits connected to that conductor.

Manufacturers recognize the potential for damage from static electrical discharge during the application and removal steps of tape masking. To minimize such damage, tapes are often bathed in ionized air before and during their application, and also during their removal. However, air ionization is not always sufficient to reduce static charges quickly enough to prevent static discharge to the components in contact with the tape.

Another attempt to solve this problem has been the use of tape with conductive adhesive. The conductive adhesive facilitates the removal of charges generated during the application or removal process by conducting these charges safely to ground. However, problems exist with the conductive adhesive approaches attempted to date. Conductive adhesive tapes are expensive to produce; most are constructed by adding a conductive component to the adhesive, such as nickel fibers, carbon powder, or conductive salts. The adhesive properties of the tape are reduced as a result of adding the conductive material to the adhesive. An additional drawback to adding metal to the adhesive is the corrosion which often occurs when two different metals of the board and adhesive come into contact with each other. These metals can form essentially a battery whereby electrical current flows, corroding the metals.

The conductive adhesives are also not always sufficiently conductive to provide the desired protection. The static charge cannot be dissipated to ground quickly enough through an adhesive having a resistivity of $10^7$–$10^9$ ohm/square to protect the masked components. To be effective the resistivity of the conductive adhesive should be $10^5$ ohm/square or less for rapid charge dissipation. Perhaps the most serious drawback to conductive adhesives has been the propensity for these compounds to leave conductive residue on the surface of the board after removal. Conductive contamination from these tapes is a well-documented serious and costly problem that can render electronic components and assemblies inoperable.

Accordingly, it is important not only to protect selected components from conformal coating, but also to protect every electrical component electrically connected to the board from static electrical discharge.

SUMMARY OF THE INVENTION

It is a primary object of the present invention to provide an improved method of applying a conformal coating to a printed circuit board on which certain components are not to be coated. In this connection, a related object of the invention is to provide such an improved method which significantly reduces the time and cost required to protect the components which are not to be coated, while at the same time protecting all the components on the board from electrostatic charges on the medium used to protect the components that are not to be coated.

It is another important object of this invention to provide an improved method of applying a conformal coating to a printed circuit board, which enables selected components on the printed circuit board to be protected from conformal coating material by a medium which can be quickly installed and removed without any danger of damage to components on the board from electrostatic charges on the protective medium. A related object is to provide such an improved method which permits the protective medium to be installed and removed in a small fraction of the time required by previously used protective processes.

A further object of this invention is to provide an improved method of the foregoing type which utilizes protective enclosures which can be rapidly and reliably massproduced at a low cost.

It is still another object of the invention to provide such a method which provides improved protection of susceptible components from the conformal coating material.

Other objects and advantages of the invention will b apparent from the following detailed description and the accompanying drawings.

In accordance with the present invention, the foregoing objectives are realized by providing a method of applying a conformal coating to a printed circuit board and components attached thereto while leaving selected components attached thereto uncoated, the method comprising the steps of providing a printed circuit board having a multiplicity of components attached thereto, including selected components that are not to be coated; enclosing the selected components within protective enclosures sized to enclose the selected components therein and thereby protect those components from the intrusion of conformal coating material, the enclosures having sufficient electrical conductivity to discharge electrostatic charges therefrom when one of the enclosures is contacted by an electrically conductive medium, thereby protecting the components attached to the printed circuit board from damage due to the discharge of electrostatic charges from the enclosures; applying a conformal coating to the printed circuit board, thereby conformal coating the enclosures and the components which are not protected by the enclosures; and removing the coated enclosures from the selected components.

BRIEF DESCRIPTION OF THE DRAWINGS

In the drawings:

FIG. 1 is a perspective view a printed circuit board in the process of being conformal coated while selected individual components and arrays of components on the printed circuit board are protected by conductive protective enclosures in accordance with the invention;

FIG. 2 is a perspective view of a preferred embodiment of the conductive protective enclosure of the present invention, and illustrating a protected component inside the enclosure in broken lines;

FIG. 3 is an enlarged section generally taken along line 3—3 in FIG. 2;

FIG. 4 is a perspective view of a single enclosure protecting a plurality of contiguous components on a printedcircuit board;

FIG. 8 is an enlarged, exploded perspective view of one of the ejector levers mounted on the front corners of the printed circuit board of FIG. 1, and a two-part conductive enclosure for protecting that ejector from the conformal coating; and FIG. 9 is an enlarged, exploded perspective view of one of the toggle switches mounted on the front edge of the printed circuit board of FIG. 1, and a two-part conductive enclosure for protecting that toggle switch from the conformal coating.

DESCRIPTION OF THE PREFERRED EMBODIMENTS

Figure 5:
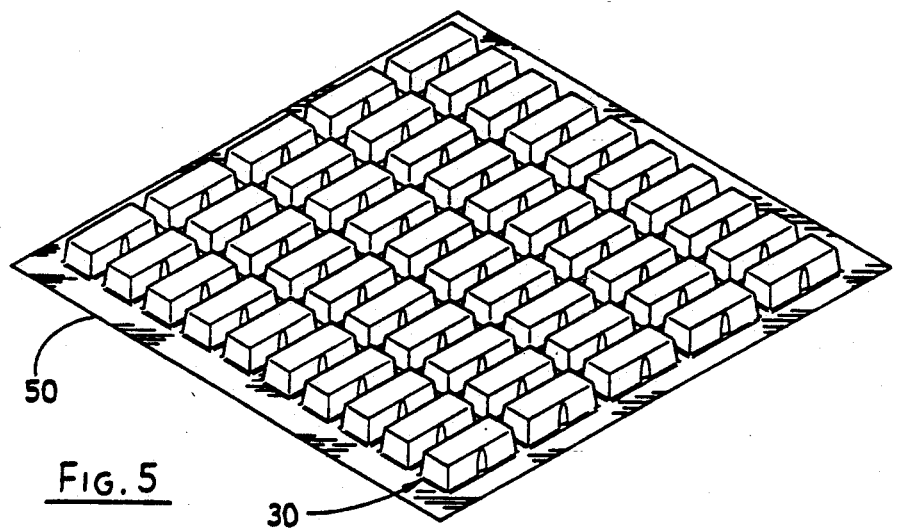
FIG. 5 is a perspective view of a single sheet of polymeric material which has been thermoformed to form a multiplicity of protective enclosures in accordance with the invention.

While the invention is susceptible to various modifications and alternative forms, a specific embodiment thereof has been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

FIG. 1 shows a printed circuit board 10 onto which a conformal coating is being applied as an aerosol spray 12 by nozzles 14. The aerosol spray 12 comprises droplets of a conformal coating material solubilized in a volatile organic solvent. The coating thickness may be controlled by varying the solvent concentration in the spray, the diameter of the nozzles 14, the number of nozzles 14, and the spraying time. Once applied, the coating is thereafter cured. Often curing occurs at room temperature, although some coating materials require elevated temperatures to cure.

FIG. 1 shows only one surface of the printed circuit board 10 being spray-coated. Typically, both sides of a printed circuit board are eventually spray-coated. Although other methods are available for coating printed circuit boards, e.g., dipping and brushing, spraying is the most common and expeditious method presently available. Spray-coating is widely employed for protecting all types and sizes of printed circuit board assemblies, and both hand and automatic equipment, as shown in FIG. 1, are used.

Conformal coatings are systems of synthetic resins dissolved in volatile organic solvent vehicles. The resins are selected with particular attention to their electrical and thermal properties, and their ability to form a thin, durable film capable of providing protection against various deleterious environmental effects and contaminants. Of the vast number of synthetic resins available, selected acrylics, polyurethanes, and epoxies are currently being used as the basis for most general-purpose conformal coatings. Conformal coatings are generally applied in thicknesses of about 0.005 to about 0.0005 inch.

When conformally coating a board, as show in FIG. 1, care must be taken not to coat any components on the board which must necessarily remain uncoated if the board is t function properly. For example, in FIG. 1 unoccupied integrated circuit sockets 16 and EPROMs 18 are illustrative of electrical components which must remain uncoated. If the conformal coating material were allowed to enter into and coat the electrical contacts of the unoccupied integrated circuit sockets 16, those sockets would become permanently inoperable. The EPROMs 18 are routinely replaced throughout the useful life of the printed circuit board, and thus it is necessary that the EPROMs 18 be readily removable and not sealed beneath the conformal coating.

Certain components used on printed circuit boards are movable and must necessarily remain so if the circuit board 10 is remain functional. For example, the exemplary board shown in FIG. 1 includes toggle switches 20 and pivoting ejectors 22 which must remain movable to perform their respective tasks. If the toggle switches 20 or the pivoting ejectors 22 were rendered immovable by application of the conformal coating thereto, the circuit board 10 to which they are attached would not function properly.

In accordance with one important aspect of the present invention, the selected components that are not to be coated are enclosed within conductive protective enclosures sized to fit snugly over the selected components and thereby protect those components from the intrusion of conformal coating material. The enclosures have sufficient electrical conductivity to discharge electrostatic charges therefrom when one of the enclosures is contacted by an electrically conductive medium, thereby protecting the components attached to the printed circuit board from damage due to the discharge of electrostatic charges from the enclosures. A conformal coating is then applied to the printed circuit board, coating both the enclosures and the components which are not protected by the enclosures. After the conformal coating has solidified, the coated enclosures are removed from the protected components.

In contrast to prior methods of protecting selected components attached to a printed circuit board during the conformal coating process, the present invention provides a conductive protective enclosure which not only protects the enclosed components from the intrusion of conformal coating material, but also protects the components on the printed circuit board from damage due to the discharge of electrostatic charges from the enclosures. Moreover, these protective enclosures can be installed and removed in a matter of seconds without the use of ionized air, thereby reducing the time and cost required for the overall conformal coating operation.

The conductive protective enclosures of the present invention provide an effective and inexpensive alternative to prior masking techniques. The protective enclosures may be mass produced in a limited number of standard sizes and styles, because the majority of components mounted on printed circuit boards are mass produced in standard sizes. For example, in the United States sockets for receiving integrated circuits are manufactured in 8, 10, 12, and 20-pin styles. According to industry practice, all such sockets are manufactured to conform to a standard size and shape. The standardization of component sizes is critical for the mass production, design, and repair of printed circuit boards. Consequently, the conductive protective enclosures of the present invention may also be mass produced in a limited number of sizes and styles. Unlike masking components with tape, the enclosures of the present invention are easily and quickly mounted on, and removed from, the desired components on a printed circuit board. As discussed above, tapes must be tailored and manually fitted around each component. Taping a single component may take several minutes, and errors are often made, resulting in high production costs for users of tape masking.

It has been determined that the time required to install the enclosures of the present invention on a single component on 1000 boards is about 16 hours. On the other hand, tape masking the same component requires about 550 hours. At a reasonable labor cost of thirty dollars per hour, the present invention would save a manufacturer about $8500.00 (eight thousand five hundred dollars) per component per 1000 boards.

Users of the present invention will realize further production savings since the enclosures of this invention are easily removable from the printed circuit board after the application of the conformal coating. Generally, the enclosures may be safely and quickly removed by simply lifting them off the printed circuit board following the application of the thin conformal coating. The ease with which the enclosures are removed is in sharp contrast to the time-consuming, and often damaging, operation of removing tape masking. The removal of the enclosures requires only seconds as opposed to several minutes for removing tape masking. Moreover, the removal of the enclosures does not harm the printed circuit board assembly in any way.

As discussed above, the cost of labor accounts for a substantial part of the total production cost of a conformal coating operation. That cost can be drastically reduced by use of the enclosures of the present invention. The reduction in labor costs associated with the safe and quick removal o the enclosures of this invention can account for a savings of several thousands of dollars per component per 1000 boards over prior masking techniques. Not only do the enclosures of the present invention provide the user with an economic utility derived from the ease of installation and removal, but the enclosures also provide generally better overall protection against the intrusion of conformal coating materials because the component being protected is enclosed in a unitary, one-piece enclosure. When properly mounted, the side walls of the enclosure engage the board around the entire base of the component being protected, and extend above the component body to join a top wall to form a secure enclosure. Thus, the enclosed component is totally protected from the intrusion of conformal coating material.

A particularly important advantage of the present invention is the protection of the components on the printed circuit board from the discharge of electrostatic charges. Whenever the conductive enclosure is contacted by a grounded conductive medium, such as the hand of an installer, any electrostatic charge on any portion of the enclosure is discharged through the conductive medium. If the enclosure were non-conductive, only that portion of the enclosure surface in direct contact with the conductive medium would be discharged through the medium.

Figure 7:
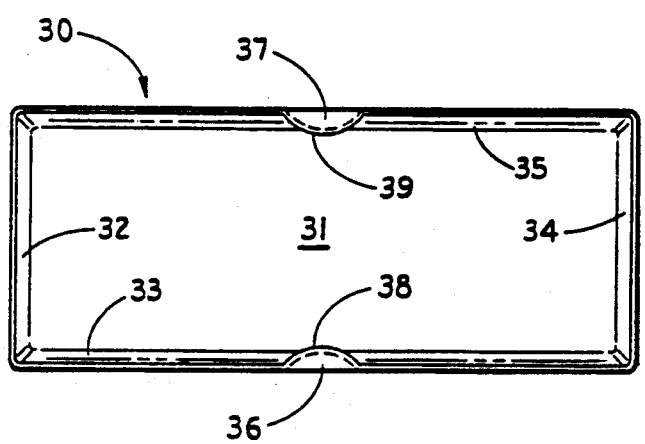
FIG. 7 is an enlarged bottom plan view of the enclosure of FIGS. 2 and 3.

In the case of the exemplary printed circuit board 10 illustrated in FIG. 1, most of the components to be protected from the conformal coating are enclosed in protective enclosures having a generally rectangular shape. One of these enclosures is illustrated in more detail in FIGS. 2, 3 and 7, from which it can be seen that the enclosure 30 has a rectangular top wall 31 and four depending side walls 32, 33, 34 and 35. The side walls flare outwardly to facilitate installation of the enclosure over the component to be protected.

One pair of opposed side walls 33 and 35 of the enclosure 30 are provided with indentations 36 and 37 which form a pair of ribs 38 and 39 extending inwardly from those side walls. When the enclosure 30 is fitted over the component to be protected, the inwardly protruding ribs 38 and 39 engage the adjacent side walls of the enclosed component to ensure frictional engagement therewith. At the same time, the engagement of the ribs 38 and 39 with the enclosed component cause the side walls 33 and 35 of the enclosure to be bowed outwardly, thereby producing a spring force which urges those side walls of the enclosure 30 inwardly against the component being protected. This further ensures frictional retention of the enclosure 30 on the component being protected during the conformal coating process.

FIG. 4 illustrates one of the larger enclosures 40 used on the printed circuit board of FIG. 1 to protect an array of IC sockets or other components which are mounted contiguously with each other on the board. Here again, one pair of opposed side walls 41 and 42 of the enclosure is provided with indentations 43 and 44 which form a pair of internal ribs which help to hold the enclosure securely in place on the components being protected.

As can be seen in FIGS. 1-4, each of the enclosures 30 and 40 are preferably formed in one piece to provide a completely closed unitary enclosure which securely protects the component or components enclosed therein from the intrusion of conformal coating material. Such enclosures can be efficiently manufactured in large numbers by molding the selected polymer into the desired shapes. The conductive polymer is selected to achieve the desired degree of conductivity (resistivity) and chemical resistance needed to withstand the conformal coating process. For example, the enclosures may be molded from polyvinyl chloride, polystyrene, or acrylic polymers, incorporating a conductive material such as graphite, carbon-black or metal powder.

Figure 6:
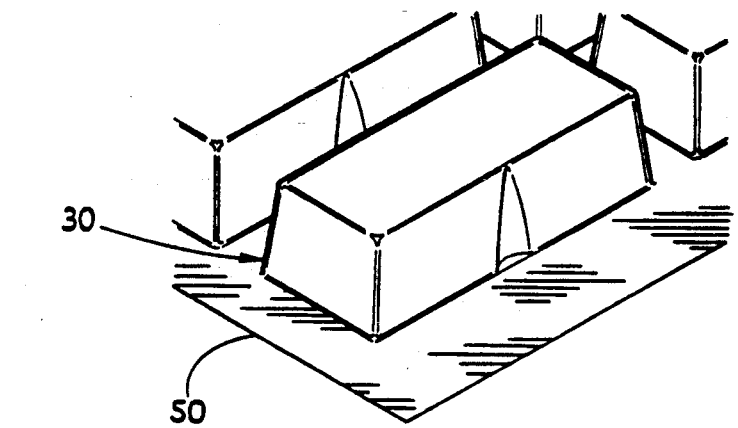
FIG. 6 is an enlarged perspective view of one corner of the thermoformed sheet of FIG. 5.

One preferred method of forming the molded enclosures is by thermoforming a multiplicity of enclosures from a single sheet of the selected polymer, as illustrated in FIGS. 5 and 6. Thermoforming is a well known technique whereby a single sheet of a polymeric material is heated and then drawn or pressed into a desired shape defined by a preformed mold. In the particular example illustrated in FIGS. 5 and 6, the polymeric sheet 50 is heated and then drawn or pressed into a mold which forms 10 rows of 5 enclosures each. Thus, a single sheet can be quickly formed into 50 enclosures.

After the polymeric sheet has been formed, the individual enclosures are die cut from the sheet, preferably in a single stamping operation. It will be readily appreciated that large numbers of the protective enclosures can be massed produced at high production rate using this technique.

Turning next to FIG. 8, there is illustrated a two-part conductive enclosure for protecting the release ejector 22 on one of the front corners of the circuit board 10 of FIG. 1. The reason for the two-part enclosure is that the release ejector 22 is exposed on both sides of the printed circuit board, and the pivot pin 22a about which the ejector turns extends all the way through the printed circuit board, as well as both sides of the ejector. Consequently, the ejector is exposed to the conformal coating material on both sides of the printed circuit board, i.e., during the coating of both sides. Thus, the protective enclosure for the ejector 22 is formed in two parts 60 and 61.

The two parts 60 and 61 of the enclosure for the ejector 22 are actually mirror images of each other. Consequently, only one of the two parts will be described in detail wit reference to FIG. 8. Referring specifically to the lower part 61, it can be seen that the opposed side walls of this enclosure form two pairs of opposed ribs 62, 63 and 64, 65, each of which functions in the same manner as the ribs 38 and 39 described above in connection with the enclosure of FIGS. 1-4. That is, when the enclosure 61 is fitted over the bottom half of the ejector 22, the ribs 62-65 engage the adjacent sidewalls of the ejector, and at the same time cause the respective sidewalls of the enclosure 61 to bow outwardly, thereby producing a spring force which tends to hold the ribs 62–65 firmly against the adjacent wall of the ejector.

FIG. 9 illustrates a two-part enclosure for one of the toggle switches 20 on the printed circuit board of FIG. 1. Specifically, the toggle switch 20 is enclosed by a front enclosure 70 which has a tapered cylindrical configuration for fitting over the cylindrical base 20a of the toggle switch. The inner end of the enclosure 70 forms an outer flange 72 which cooperates with the second enclosure 71 to hold the first enclosure 70 securely in place. More particularly, the enclosure 71 fits downwardly over the flange 72, so that the flange is captured within the enclosure 71 and thereby held securely in place on the toggle switch 20. The enclosure 71 is of a general rectangular shape so as to fit over the square portion 20b of the switch base that is attached to the printed circuit board.

We claim:

1. A method of applying a conformal coating to a printed circuit board and components attached thereto while leaving selected components attached thereto uncoated, the method comprising the steps of:

providing a printed circuit board having a multiplicity of components attached thereto, including said selected components;

enclosing said selected components within protective enclosures, sized to enclose said selected components therein and thereby protect said selected components from the intrusion of conformal coating material, said enclosures having sufficient electrical conductivity to discharge electrostatic charges therefrom when one of said enclosures is contacted by an electrically conductive medium, thereby protecting the components attached to said printed circuit board from damage due to the discharge of electrostatic charges from said enclosures;

applying a conformal coating to said printed circuit board, thereby conformal coating said enclosures and the components which are not protected by said enclosures; and removing said coated enclosures from said selected components.

2. A method for coating a first component attached to a printed circuit board while leaving an adjacent second component attached thereto uncoated, the method comprising the steps of:

providing a printed circuit board including said first component and said second component attached thereto;

enclosing said second component within a conductive protective enclosure, said conductive protective enclosure including a solid one-piece conductive plastic body member having a top wall, and four depending side walls, said top and side walls being sized to enclose said second component therein, thereby protecting said second component from the intrusion of conformal coating material, said conductive protective enclosure having sufficient electrical conductivity to discharge electrostatic charges when said conductive protective enclosure is contacted by an electrically conductive medium, thereby protecting said second component enclosed therein from damage due to the discharge of electrostatic charges through said second component;

applying said conformal coating to said printed circuit board, thereby conformal coating said first component and said conductive protective enclosure; and removing said conformal coated conductive protective enclosure.

3. The method of claim 2 wherein said conformal coating is electrically non-conductive and is applied to said printed circuit board by spraying.

* * * * *